(12) United States Patent
Gopalakrishnan et al.

(10) Patent No.: US 8,114,723 B2
(45) Date of Patent: Feb. 14, 2012

(54) METHOD OF FORMING MULTI-HIGH-DENSITY MEMORY DEVICES AND ARCHITECTURES

(75) Inventors: Kailash Gopalakrishnan, San Jose, CA (US); Rohit Sudhir Shenoy, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/794,826

(22) Filed: Jun. 7, 2010

(65) Prior Publication Data

US 2010/0248441 A1   Sep. 30, 2010

Related U.S. Application Data

(62) Division of application No. 11/427,487, filed on Jun. 29, 2006, now Pat. No. 7,763,932.

(51) Int. Cl.
*H01L 21/84* (2006.01)
(52) U.S. Cl. ........ 438/151; 438/157; 438/163; 438/164; 438/947; 257/E21.036; 257/E21.561; 257/E21.68; 977/888; 977/936
(58) Field of Classification Search ........ 438/151, 438/157, 163, 164, 947; 257/E21.036, E21.68; 977/888, 936
See application file for complete search history.

(56) References Cited

U.S. PATENT DOCUMENTS

| | | | |
|---|---|---|---|
| 6,256,767 | B1 | 7/2001 | Kuekes et al. |
| 6,750,100 | B2 | 6/2004 | Hsu et al. |
| 6,760,245 | B2 | 7/2004 | Eaton, Jr. et al. |
| 6,781,166 | B2 | 8/2004 | Lieber et al. |
| 6,958,512 | B1 | 10/2005 | Wu et al. |
| 6,963,104 | B2 | 11/2005 | Wu et al. |
| 2004/0113139 | A1 | 6/2004 | DeHon et al. |
| 2005/0009286 | A1 | 1/2005 | Hsu et al. |
| 2005/0162881 | A1 | 7/2005 | Stasiak et al. |
| 2005/0269629 | A1* | 12/2005 | Lee et al. ............ 257/327 |
| 2007/0287256 | A1* | 12/2007 | Chang et al. ......... 438/283 |

OTHER PUBLICATIONS

Notice of Allowance (Mail Date Mar. 22, 2010) for U.S. Appl. No. 11/427,487, filed Jun. 29, 2006, Confirmation No. 2516.

* cited by examiner

*Primary Examiner* — Mary Wilczewski
*Assistant Examiner* — Toniae Thomas
(74) *Attorney, Agent, or Firm* — Schmeiser, Olsen & Watts (57) ABSTRACT

A structure, memory devices using the structure, and methods of fabricating the structure. The structure includes: an array of nano-fins, each nano-fin comprising an elongated block of semiconductor material extending axially along a first direction, the nano-fins arranged in groups of at least two nano-fins each, wherein ends of nano-fins of each adjacent group of nano-fins are staggered with respect to each other on both a first and a second side of the array; wherein nano-fins of each group of nano-fins are electrically connected to a common contact that is specific to each group of nano-fins such that the common contacts comprise a first common contact on the first side of the array and a second common contact on the second side of the array; and wherein each group of nano-fins has at least two gates that electrically control the conductance of nano-fins of the each group of nano-fins.

20 Claims, 12 Drawing Sheets

METHOD OF FORMING MULTI-HIGH-DENSITY MEMORY DEVICES AND ARCHITECTURES

RELATED APPLICATIONS

This application is a division of U.S. patent application Ser. No. 11/427,487, now U.S. Pat. No. 7,763,932, issued Jul. 27, 2010, filed on Jun. 29, 2006.

FIELD OF THE INVENTION

The present invention relates to the field of semiconductor devices; more specifically, it relates to a multi-bit high-density memory device and architecture and methods of fabricating multi-bit high-density memory devices.

BACKGROUND OF THE INVENTION

In an effort to drastically increase the density of memory devices that are fabricated with conventional semiconductor processes and are compatible with conventional complimentary metal oxide silicon (CMOS) technology, efforts have been directed to devices that combine normal photolithographic groundrule and sub-photolithographic groundrule dimensions. However, there is a "pattern-mismatch" when normal photolithographic groundrule and sub-photolithographic groundrule structures are used in the same structure. "Pattern-mismatch" can cause yield loss and imperfect connections. Therefore, there is a need for an interface device, memory device, memory device architecture and method of fabricating memory devices that use normal photolithographic groundrule and sub-photolithographic groundrule structures that avoids this type of "pattern-mismatch."

SUMMARY OF THE INVENTION

A first aspect of the present invention is a structure, comprising: a structure, comprising: an array of nano-fins, each nano-fin comprising an elongated block of semiconductor material extending axially along a first direction, the nano-fins arranged in groups of at least two nano-fins each, wherein ends of nano-fins of each adjacent group of nano-fins are staggered with respect to each other on both a first and a second side of the array; wherein nano-fins of each group of nano-fins are electrically connected to a common contact that is specific to each group of nano-fins such that the common contacts comprise a first common contact on the first side of the array and a second common contact on the second side of the array; and wherein each group of nano-fins has at least two gates that electrically control the conductance of nano-fins of the each group of nano-fins.

A second aspect of the present invention is the first aspect, further including: a channel region in each nano-fin between adjacent gates of the at least two gates; and a respective source region and a respective drain region in each nano-fin, the respective source and drain regions separated by a respective channel region.

A third aspect of the present invention is the first aspect, wherein for each group of nano-fins, at least one gate of the at least two gates is a control gate adjacent to an outermost nano-fin of the each group of nano-fins and at least one gate of the at least two gates is a floating gate between adjacent nano-fins of the each group of nano-fins and wherein the control gate is tied to a voltage source and the at least one floating gate is electrically floating.

A fourth aspect of the present invention is the first aspect, further including, for each group of nano-fins, a gate dielectric between each nano-fin of and gates of the at least two gates associated with each the group of nano-fins.

A fifth aspect of the present invention is the first aspect, further including at least one memory element electrically connected to at least one of the nano-fins of the array of nano-fins.

A sixth aspect of the present invention is the fifth aspect, wherein the at least one memory element is selected from the group consisting of anti-fuses, DRAM cells, phase-change memory cells, solid-electrolyte memory cells, ferro-electric memory cells, magneto-resistive random access memory cells, oxide based resistive memory cells and organic-based resistive memory cells.

A seventh aspect of the present invention is the first aspect, wherein a pitch of the nano-fins of the array of nano-fins in a second direction perpendicular to the first direction is less than a smallest pitch lithographically definable by a photolithographic system used to define each the at least two gates.

An eighth aspect of the present invention is the first aspect, wherein a width of the nano-fins of the array of nano-fins in a second direction perpendicular to the first direction is less than about 50 nm.

A ninth aspect of the present invention is the first aspect, wherein a width, in a second direction, of gates of the first and second set of gates located between adjacent nano-fins of a same group of nano-fins is less than about 50 nm and a width, in the second direction, of gates of the first and second sets of gates located between nano-fins of adjacent groups of nano-fins is equal to or greater than about 180 nm, the second direction perpendicular to the first direction.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

FIGS. 4A through 8A are isometric views and FIGS. 4B through 8B are corresponding top views of an exemplary fabrication process for a nano-fin array and corresponding MNABs according to the embodiments of the present invention;

DETAILED DESCRIPTION OF THE INVENTION

Figure 1A:
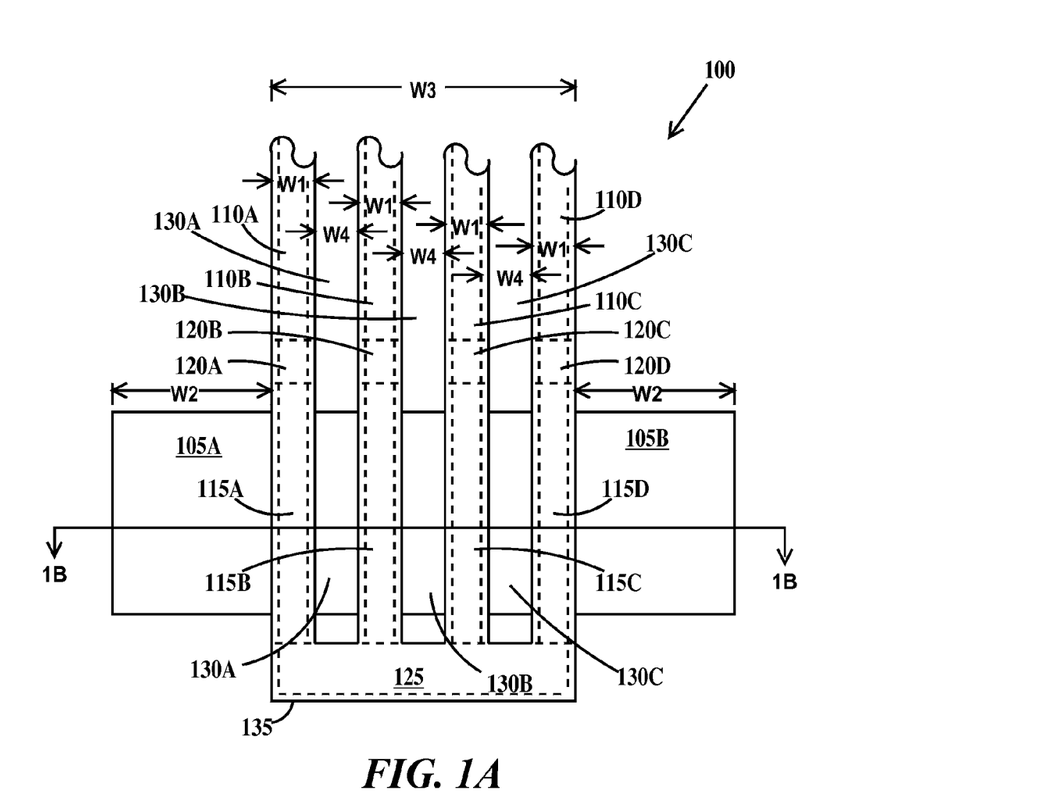
FIG. 1A is a top view and FIG. 1B is a cross-sectional view through line 1B-1B of FIG. 1A of a general micro-to nano address block (MNAB) illustrating the principles of operation of the MNAB.
Figure 1B:
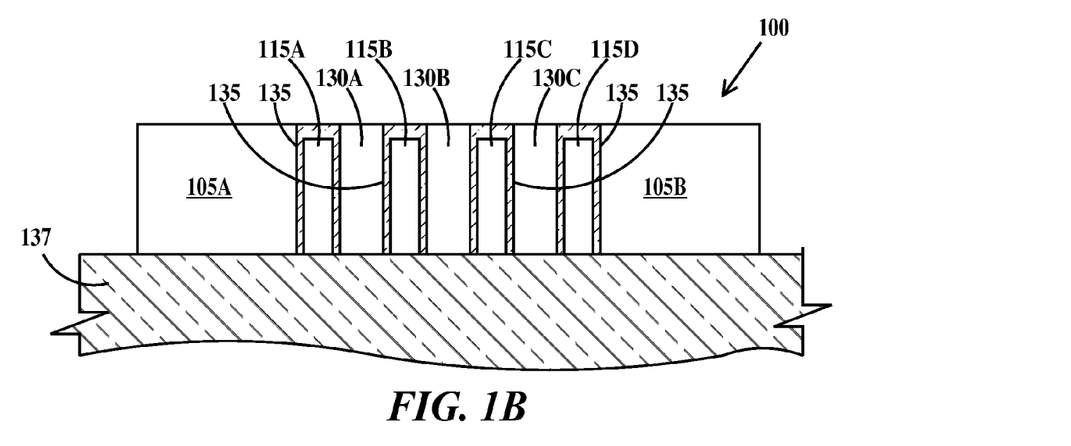

FIG. 1A is a top view and FIG. 1B is a cross-sectional view through line 1B-1B of FIG. 1A of a micro-to-nano address block (MNAB) illustrating the principles of operation of the MNAB. MNABs provide selection of the individual nano-fins of a nano-fin array. In FIGS. 1A and 1B, a MNAB 100 includes first and second polysilicon control gates 105A and 105B and single-crystal silicon nano-fins 110A, 110B, 110C and 110D. Nano-fins 110A, 110B, 110C and 110D include respective channel regions 115A, 115B, 115C and 115D and drain (or source) regions 120A, 120B, 120C and 120D and a common source (or drain) region 125. Channel regions 115A and 115B are separated by an electrically floating doped-polysilicon region 130A. Channel regions 115B and 115C are separated by an electrically floating doped-polysilicon region 130B. Channel regions 115C and 115D are separated by an electrically floating doped-polysilicon region 130C. Nano-fins 110A, 110B, 110C and 110D and first and second gates 105A and 105B are formed on a dielectric layer 137. A thin dielectric layer 135 electrically isolates first and second gates 105A and 105B and nano-fins 110A, 110B, 110C and 110D from each other. Dielectric layer 135 also acts a gate dielectric for MNAB 100.

The doping level of channel regions 115A, 115B, 115C and 115D is selected so they conduct drain-source currents at zero gate bias similar to a depletion-mode field effect transistor. The work function difference between the floating doped-polysilicon regions 130A, 130B and 130C and channel regions 115A, 115B, 115C and 115D induces inversion layers in the channel regions causing them to conduct at zero gate-bias. Applying voltages to control gates 105A and 105B causes selected channel regions 115A, 115B, 115C and 115D to deplete (since the potential on electrically floating doped polysilicon regions are strongly coupled to the potential on control gates 105A and 105B) and no longer conduct. While four nano-fins are illustrated in FIGS. 1A and 1B, the number of nano-fins between control gates 105A and 105B may any number equal to or greater than two. Channel regions 115A, 115B, 115C and 115D may be intrinsic or doped.

Each nano-fin 110A, 110B, 110C and 110D has a width W1 (in a widthwise direction) and is spaced apart from any adjacent nano-fin by a distance W4 where (W1+W4) has a value that is less than the smallest pitch lithographically definable by a given technology. Pitch is width of a line and the width of a space between the line and an adjacent line. For example, for 130 nm technology, the smallest features that can be imaged and still meet critical dimension (CD) variation, line edge roughness (LER) and misalignment (MA) tolerance specifications for 130 nm technology have a 260 nm pitch. For 90 nm technology, the smallest dimensions that can be imaged and still meet CD variation, line edge roughness LER specifications and MA tolerance have a 180 nm pitch. Control gates 105A and 105B have a width W2. The distance between control gates 105A and 105B is W3. W2+W3 has a value that is equal to or greater than the minimum pitch that can be defined using lithography for a given technology. All lengthwise dimensions (perpendicular to the widthwise direction) also have values that are equal to or greater than the smallest dimension lithographically definable by the given technology. In one example W1 is less than about 50 nm. In one example, W1 is between about 10 nm and about 20 nm. The perpendicular distance between adjacent nano-fins is W4. In one example W4 has a value that is less than the smallest dimension lithographically definable by a given technology. In one example, W1=W4.

Line/space pairs (a line and the space between the line and an adjacent line) having a pitch less than the smallest lithographically definable pitch may be called nano-scale lines and spaces.

In the example that channel regions 115A, 115B, 115C and 115D are doped N-type, Table I illustrates how different channel regions may be selectively depleted, allowing selection of any of the four nano-fins 110A, 110B, 110C and 110D.

TABLE I

Applied Control Gate Voltage versus
Nano-Fin Channel Region Conduction

| Control Gate 105A Voltage | Control Gate 105B Voltage | Channel region 115A | Channel region 115B | Channel region 115C | Channel region 115D |
| --- | --- | --- | --- | --- | --- |
| =0 Volts | <<0 Volts | Conducts | Depleted | Depleted | Depleted |
| <0 Volts | <<0 Volts | Depleted | Conducts | Depleted | Depleted |
| <<0 Volts | <0 volts | Depleted | Depleted | Conducts | Depleted |
| <<0 Volts | =0 Volts | Depleted | Depleted | Depleted | Conducts |
| >=0 Volts | <0 Volts | Conducts | Conducts | Conducts | Depleted |
| >=0 Volts | <<0 Volts | Conducts | Conducts | Depleted | Depleted |
| <0 Volts | >=0 Volts | Depleted | Conducts | Conducts | Conducts |
| <<Volts | >=0 Volts | Depleted | Depleted | Conducts | Conducts |

The exact values of voltages applied depends on a number of parameters including the doping levels of the channel regions of the nano-fins, the doping levels of the polysilicon regions, the oxide thickness and the number and widths of the nano-fins.

Figure 2:
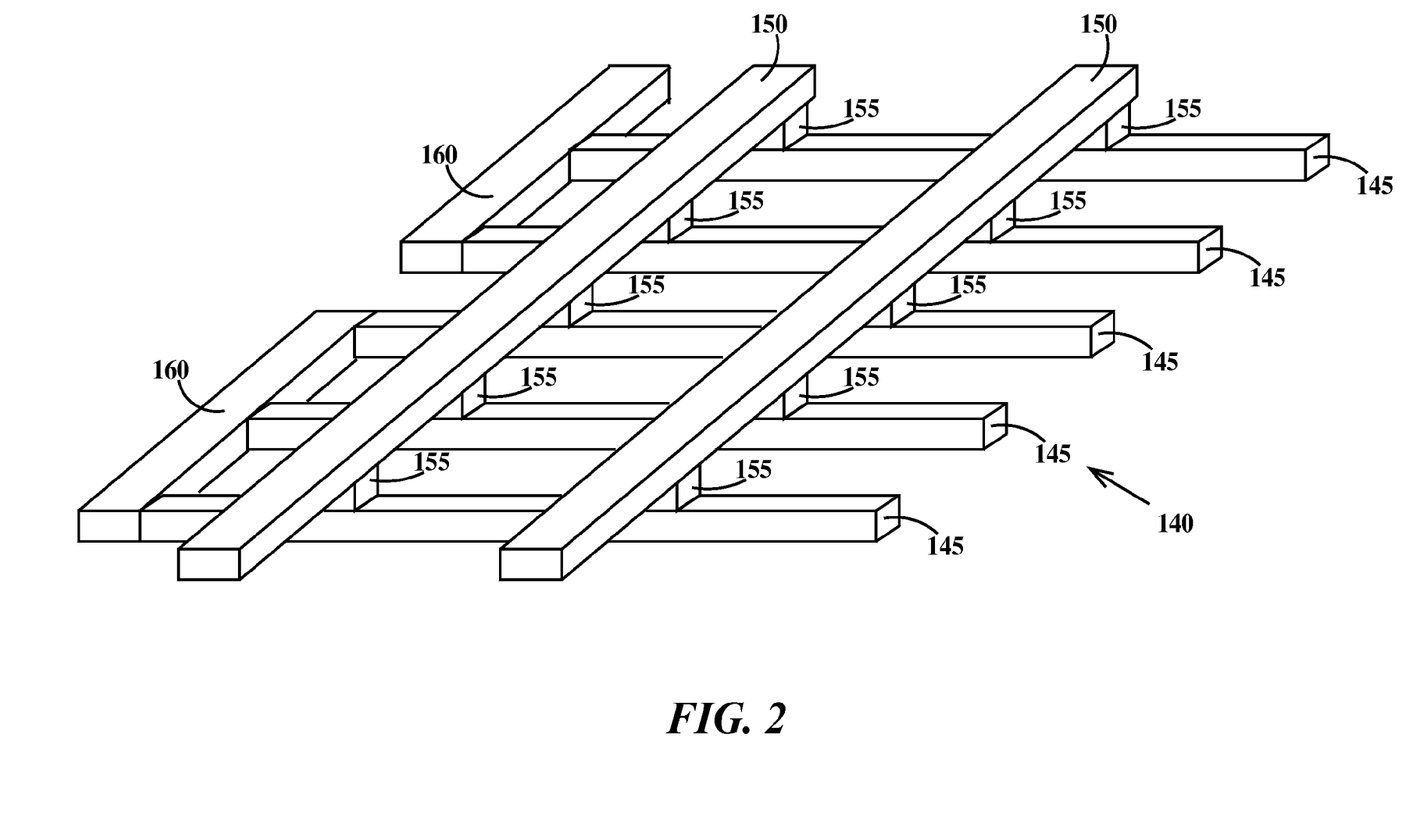
FIG. 2 is an isometric view of a portion of a general nano cross bar array (NCA) memory according to the embodiments of the present invention.

FIG. 2 is an isometric view of a portion of a general nano cross bar array (NCA) memory according to the embodiments of the present invention. In FIG. 2, nano-fins 145 are positioned perpendicular to groups of electrically conductive lines 150 and separated by rectifying or memory (data storage) elements 155. Groups of nano-fins 145 are connected to MNABs 160 similarly to nano-fins 115A, 115B, 115C and 115D of MNAB 100 of FIGS. 1A and 1B. In one example, electrically conductive wires 150 are conventional micro-scale wires. In one example, electrically conductive wires 150 are nano-fins, which are connected to additional MNABs (not shown). Nano-fins 145 may be wordlines connected to word-line decoders through MNABs and lines 150 may be bitlines connected to column selects and/or sense amplifiers, or nano-fins 145 may be bitlines connected to column selects/sense amplifiers through MNABs (the MNABs connected to bitline address decoders) and lines 150 may be the wordlines. Examples of devices suitable for use as memory elements 155 include, but are not limited to anti-fuses, DRAM capacitors, phase-change memory cells, solid-electrolyte memory cells, ferro-electric memory cells, magneto-resistive random access memory (mram) cells, oxide based resistive memory cells and organic-based resistive memory cells, while rectifying elements may include but are not limited to p-n junctions, diodes, Schottky barrier diodes, metal-oxide field effect transistors (MOSFETs) including p-channel FETs (PFETs) and n-channel FETs (NFETs), bipolar junction transistors or alternately the memory element may itself have rectifying properties.

Figure 3A:
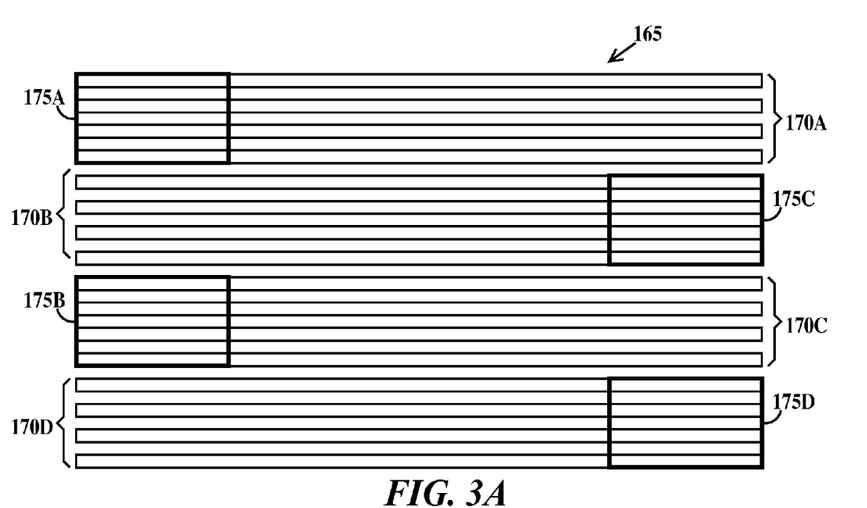
FIG. 3A is a schematic diagram illustrating relative positions of control gates of MNABs relative to nano-fins of a nano-scale array according to an embodiment of the present invention.

FIG. 3A is a schematic diagram illustrating relative positions of control gates of MNABs relative to nano-fins of a nano-scale array according to an embodiment of the present invention. In FIG. 3A, a MNAB layout 165 includes sets of nano-fins 170A, 170B, 170C and 170D and control gates 175A, 175B, 175C and 175D of the MNABs. Only a portion of MNAB layout 165 is illustrated in FIG. 3A. The polysilicon regions between the individual nano-fins, the sources, drains and channels of the nano-fins are not illustrated for clarity. Control gates 175A and 175B select nano-fins from nano-fin set 170B. Control gates 175C and 175D select nano-fins from nano-fin set 170C.

Control gates 175A, 175B, 175C and 175D are shown in ideal alignment to respective sets of nano-fins 170A, 170B, 170C and 170D. However, because of CD variation, LER and MA tolerances, often more or less than the designed number of nano-fins will be overlaid by control gates or will lie between the control gates. In the present example, four nano-fins should be overlaid by each control gate, but as few as three and as many as five could be overlaid because of CD variation, LER and MA tolerances. For, example, with 10 nm wide nano-fins spaced 10 nm apart, an LER of 6 nm can cause an unwanted overlap of a control gate and an adjacent nano-fin. This problem is overcome in the layout of FIG. 3B.

Figure 3B:
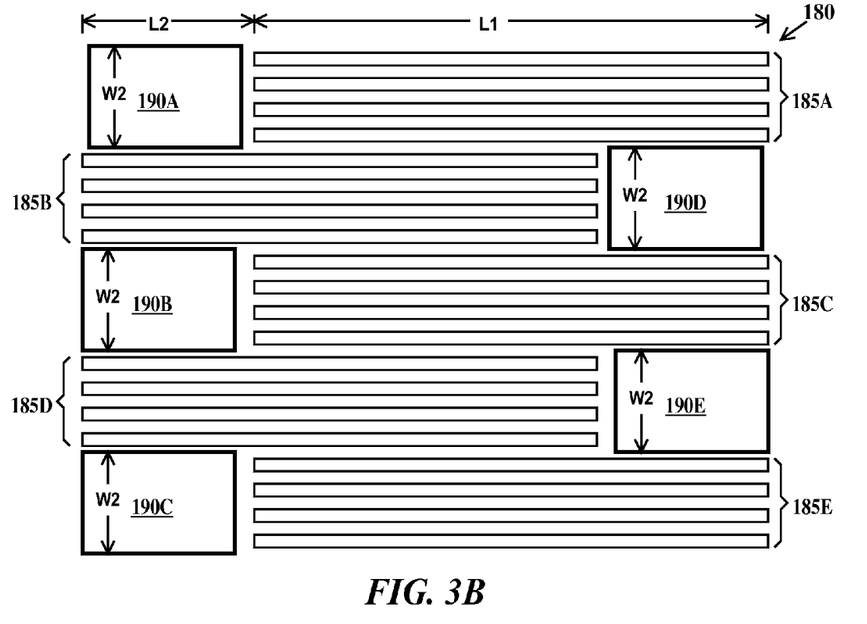
FIG. 3B is a schematic diagram illustrating relative positions control gates of MNABs relative to nano-fins of a nano-scale array according to other embodiments of the present invention.

FIG. 3B is a schematic diagram illustrating relative positions control gates of MNABs relative to nano-fins of a nano-scale array according to other embodiments of the present invention. In FIG. 3B, an MNAB layout 180 includes sets of nano-fins 185A, 185B, 185C, 185D and 185E and control gates 190A, 190B, 190C, 190D and 190E of the MNABs. Only a portion of MNAB layout 180 is illustrated in FIG. 3B. The polysilicon regions between the individual nano-fins of the same set of nano-fins (the floating gates), the sources, drains and channels of the nano-fins are not illustrated for clarity. Each of sets of nano-fins 185A, 185B, 185C, 185D and 185E may have the same length L1 but every other set of nano-fins is offset lengthwise by a distance L2. In other words, the ends of nano-fins in alternating sets of nano-fins are staggered with respect to each other on a first side of the array and on a second and opposite side of the array. The width of control gates 190A, 190B, 190C, 190D and 190E is W2 described supra.

In FIG. 3B, nano-fin sets 185B and 185D are offset from nano-fin sets 185A, 185C and 185E. Control gates 190A, 190B, 190C, 190D and 190E are aligned in the spaces created by the periodic offset of nano-fin sets 185A, 185B, 185C, 185D and 185E. While each nano-fin set is illustrated as having four nano-fins, each set may have two or more nano-fins. While the number of nano-fins in each set of nano fins need not be the same number, it is advantageous that the number of nano-fins in each set of nano fins be the same number.

Control gates 190A and 190B select nano-fins from nano-fin set 185B. Control gates 190B and 190C select nano-fins from nano-fin set 185D. Control gates 190D and 190E select nano-fins from nano-fin set 185C.

Control gates 190A, 190B, 190C, 190D and 190E are shown in ideal alignment to respective sets of nano-fins 185A, 185B, 185C, 185D and 185E. In the layout of FIG. 3B, normal CD variation, LER and MA tolerances, will not cause more or less than the designed number of nano-fins will be overlaid by (or lie between the) control gates. For, example, with 10 nm wide nano-fins spaced 10 with a CD of +/−2 nm, the width of four adjacent nano-fins would be 78 to 80 nm. This allows the structure to "absorb" any CD, LER and misalignment related fluctuations at the nanoscale or the lithographically defined gates.

In FIG. 3B, gates 190A, 190B and 190C do not extend past the ends of nano-fin sets 185B and 185D (though they may), and gates 190D and 190E do not extend past the ends of sets of nano-fins 185A, 185C and 185E (though they may).

Figure 4A:
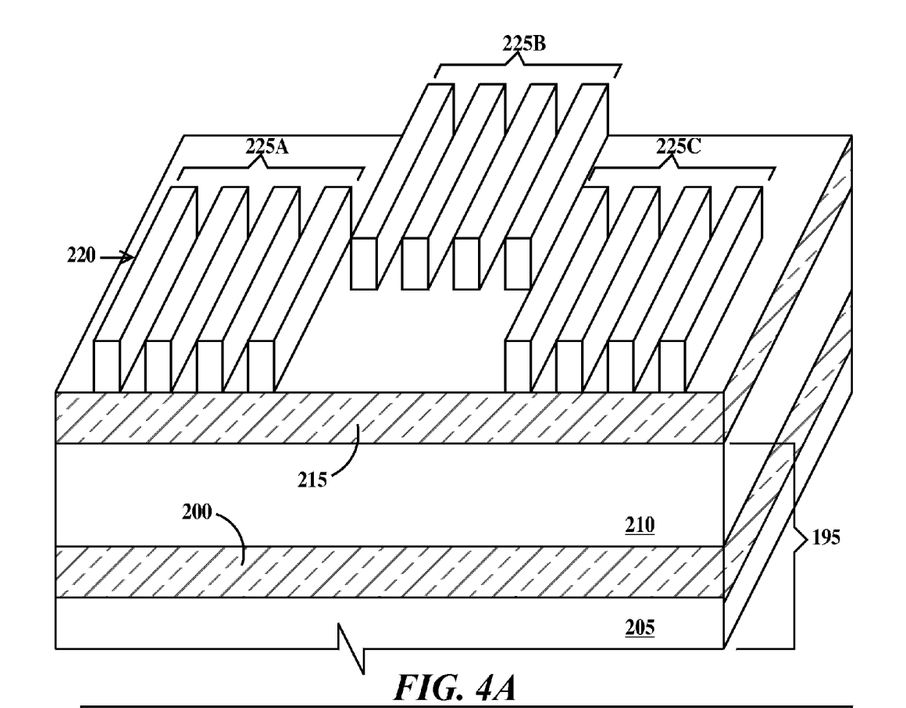
Figure 4B:
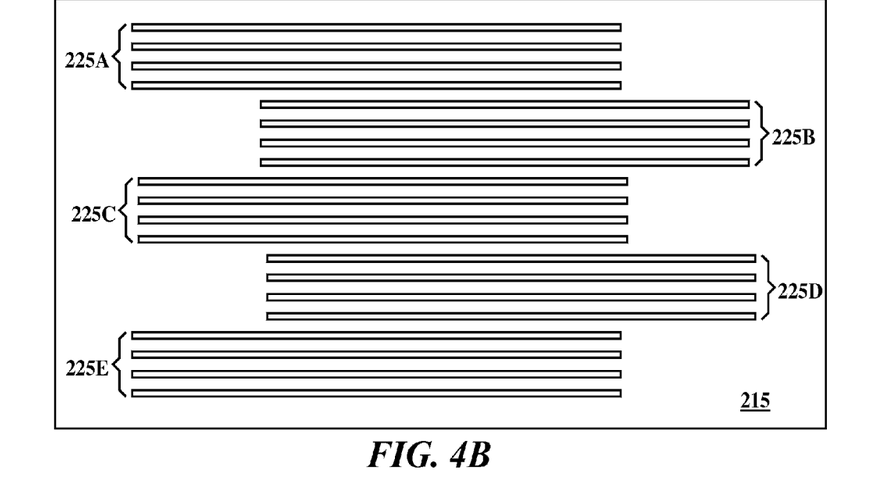

FIGS. 4A through 8A are isometric views and FIGS. 4B through 8B are corresponding top views of an exemplary fabrication process for a nano-fin array and corresponding MNABs according to the embodiments of the present invention. In FIGS. 4A and 4B, a silicon-on-insulator (SOI) substrate 195 includes a buried oxide layer (BOX) 200 formed between lower and upper single crystal silicon layers 205 and 210. In one example, upper silicon layer is doped N or P type (depending on whether the MNAB will comprise PFETs or NFETs respectively) to a concentration of between about 2E14 atm/cm$^3$ and about 1E19 atm/cm$^3$. Formed on a top of upper silicon layer 210 is a dielectric hardmask layer 215. In one example, hardmask layer 215 comprises silicon dioxide. Formed on top of hardmask layer 215 is a nano-imprint resist pattern 220 comprising sets of nano-fin images 225A, 225B, 225C, 225D, and 225E. While four nano-fins are illustrated in each set of nano-fin images 225A, 225B, 225C, 225D, and 225E, the number of nano-fins in each set may be any number equal to or greater than two. Advantageously, each set of nano-fin images 225A, 225B, 225C, 225D, and 225E should have the same number of nano-fins to reduce the number of different control gate voltages that need to be generated and routed. Nano-imprint pattern 220 is advantageously formed by a nano-imprint process. In a nano-imprint process, a polymerizable material is deformed by pressing a mold or template into a layer of the photoactive material and then curing the material with UV light or heat while the mold or template is still in place. After removal of the mold or template, a patterned layer of the now polymerized material is left which has a negative topology with respect to that of the mold or template. The nano-fin mold may be made using electron beam lithography, interferometric lithography or by self-assembly block copolymers. In self-assembly, periodic patterns are formed as a result of separation of the mixture into distinct phases upon annealing. Alternately, instead of nanoimprint lithography, self-assembly or direct-e-beam write technologies could be used to define the nano-fin structures.

Figure 5A:
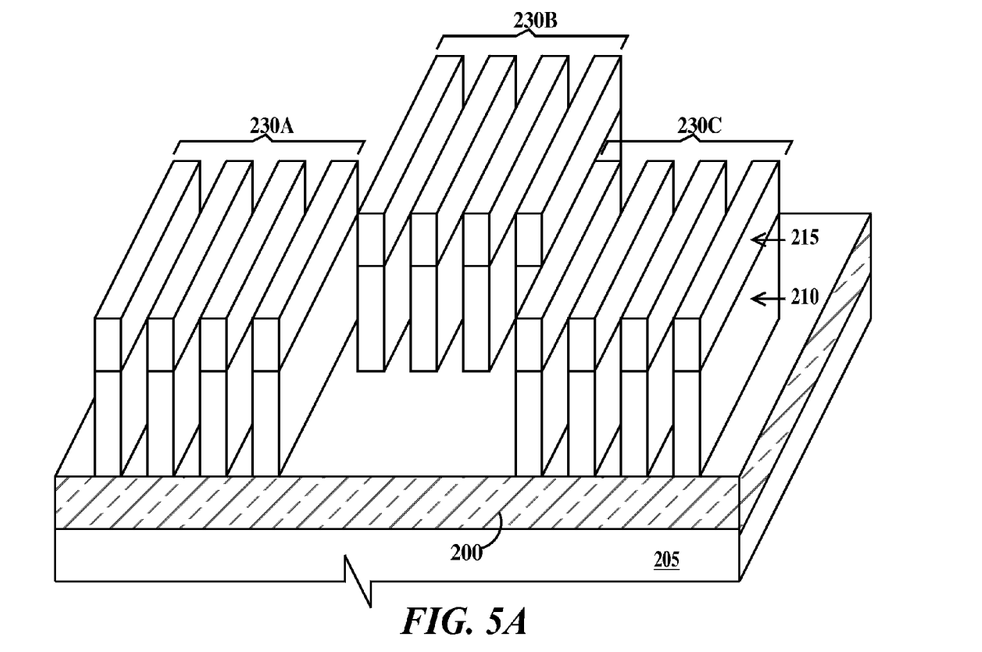
Figure 5B:
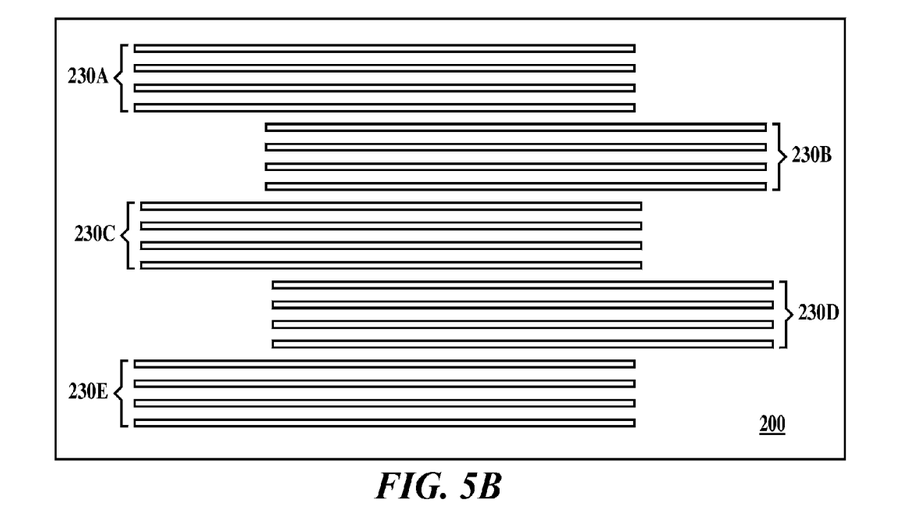

In FIGS. 5A and 5B, nano-imprint pattern 220 (see FIGS. 4A and 4B) has been transferred into hardmask layer 215 using the nano-imprint pattern as an etch mask, the nano-imprint pattern is removed and the pattern in the hardmask layer is transferred into upper silicon layer 210 (see FIGS. 4A and 4B) by an etch process (for example—a reactive ion etch or RIE) selective to etch silicon over silicon dioxide to form sets of hard mask layer covered nano-fins 230A, 230B, 230C, 230D and 230E. Then a sacrificial oxide is grown on all exposed surfaces of the nano-fins, the sacrificial oxide is removed (to remove damage to the silicon crystal structure at the exposed surfaces of the nano-fins) and a gate dielectric layer (not shown in FIGS. 5A and 5B) is formed on all exposed surfaces of nano-fins.

In one example, the gate dielectric layer is silicon dioxide ($SiO_2$), silicon nitride ($Si_3N_4$), silicon carbide (SiC), silicon oxy nitride (SiON), silicon oxy carbide (SiOC), organosilicate glass (SiCOH), plasma-enhanced silicon nitride ($PSiN_x$) or NBLok (SiC(N,H)). In one example, the gate dielectric layer is a high K (dielectric constant) material, examples of which include but are not limited metal oxides such as $Ta_2O_5$, $BaTiO_3$, $HfO_2$, $ZrO_2$, $Al_2O_3$, or metal silicates such as HfSi$_x$O$_y$, or HfSi$_x$O$_y$N$_z$ or combinations of layers thereof. A high K dielectric material has a relative permittivity above about 7.

Figure 6A:
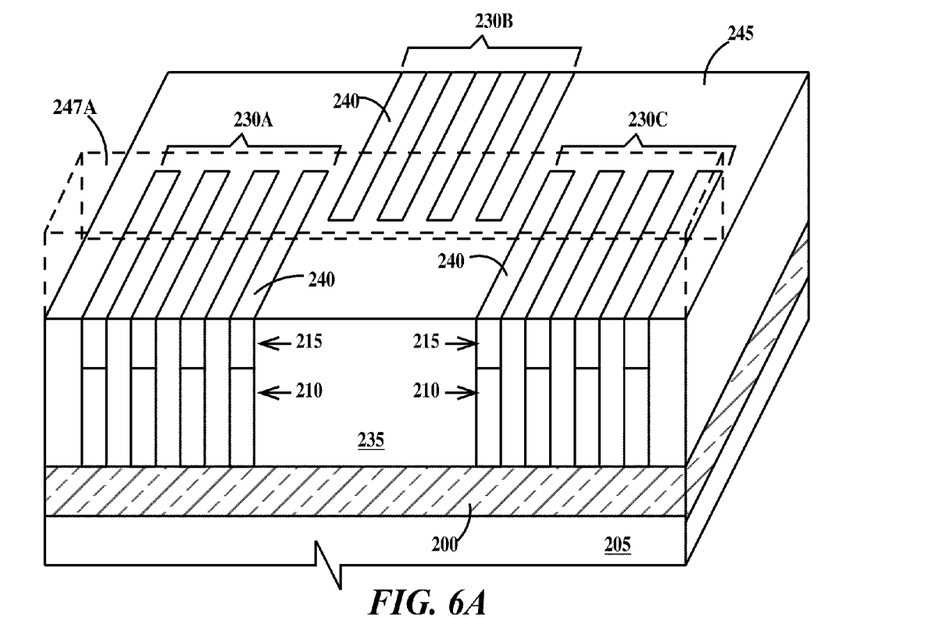
Figure 6B:
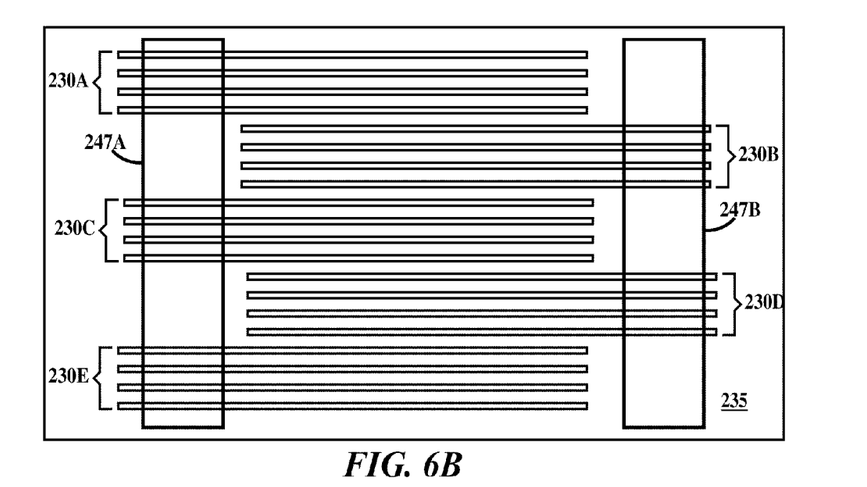

In FIGS. 6A and 6B, a polysilicon layer 235 is deposited on top of BOX layer 200 and sets of hard mask layer covered nano-fins 230A, 230B, 230C, 230D and 230E, and a chemical-mechanical-polish (CMP) is performed to coplanarize top surfaces 240 of hardmask layer 215 and a top surface 245 of polysilicon layer 235. In one example, polysilicon layer 235 is doped N or P type (depending on whether the MNAB will comprise PFETs or NFETs respectively) to a concentration of between about 2E16 atm/cm$^3$ and about 5E21 atm/cm$^3$. A gate mask 247A is formed on the top surface of polysilicon layer 235 and on the top surfaces of hardmask layer 215. The gate mask extends over regions of the first ends of nano-fins 230A and 230C s, but not over any portion of nano-fins 230B.

Figure 7A:
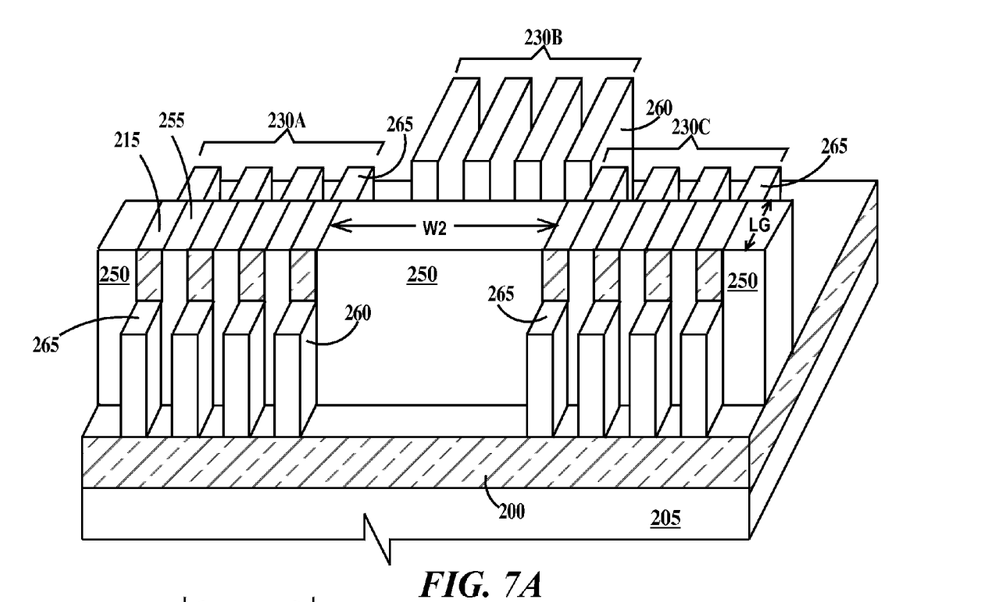
Figure 7B:
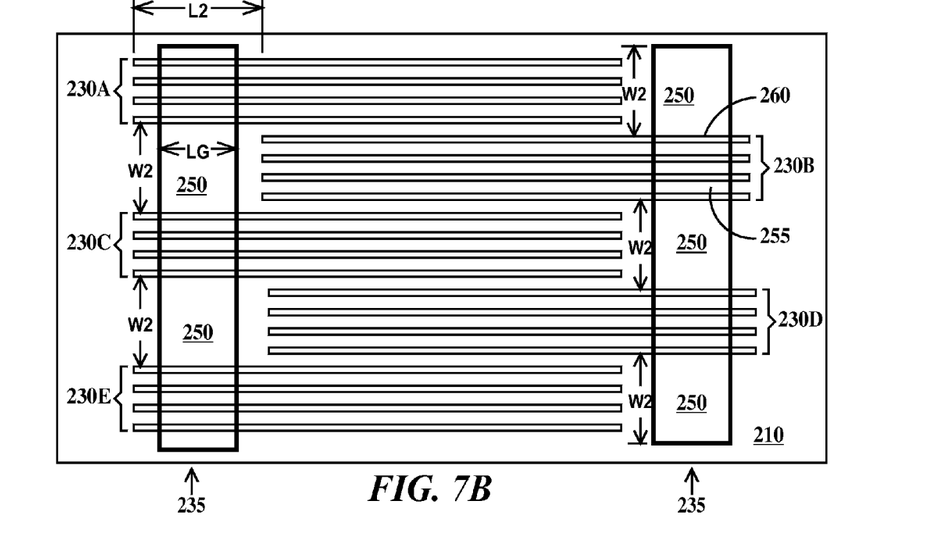

In FIGS. 7A and 7B, polysilicon layer 235 (see FIG. 6A) is etched using an RIE selective to etch polysilicon relative to dielectric layers to form control gates 250 of MNAB devices, as well as polysilicon regions 255 between individual nano-fins 260 of sets of nano-fins 230A, 230B, 230C, 230D and 230E. Then, with the gate masks 247A and 247B still in place, an RIE selective to etch silicon dioxide relative to silicon is performed to expose top surfaces 265 of nano-fins 260 not protected by polysilicon layer 235. Then gate masks 247A and 247B are removed. The distance L2 (described supra) is greater than the gate length LG of control gates 250. LG is equal to or greater than the smallest dimension lithographically definable by the photolithographic process used to define the control gates. L2 is greater than the smallest dimension lithographically definable by the photolithographic process used to define the control gates. Next an extension ion implantation of nano-fins 260 is performed. If the MNABs are to comprise PFETs, the extension ion implantation implants a P-type dopant species. If the MNABs are to comprise NFETs, the extension ion implantation implants an N-type dopant species. The extension ion implant is optional.

Figure 8A:
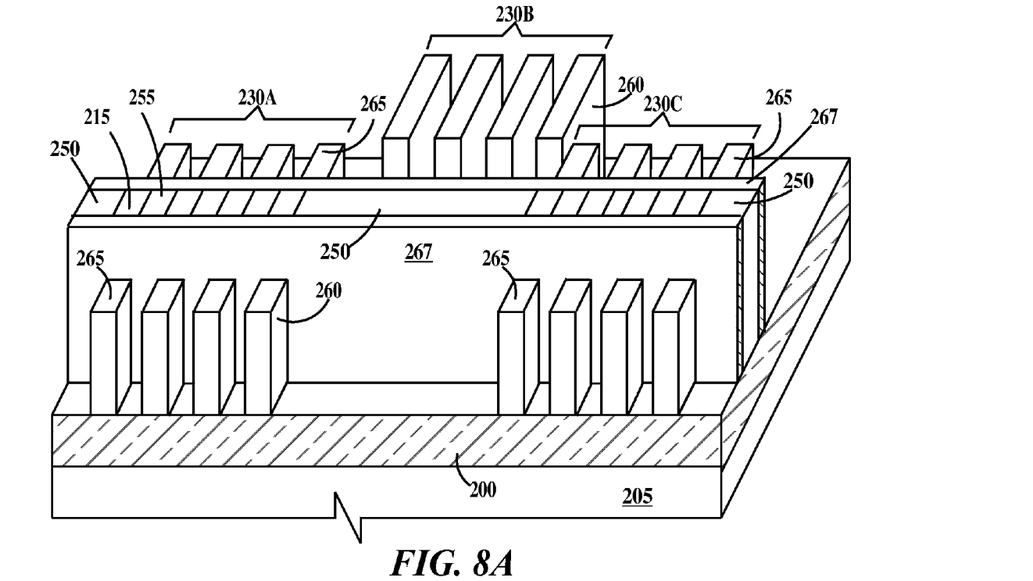
Figure 8B:
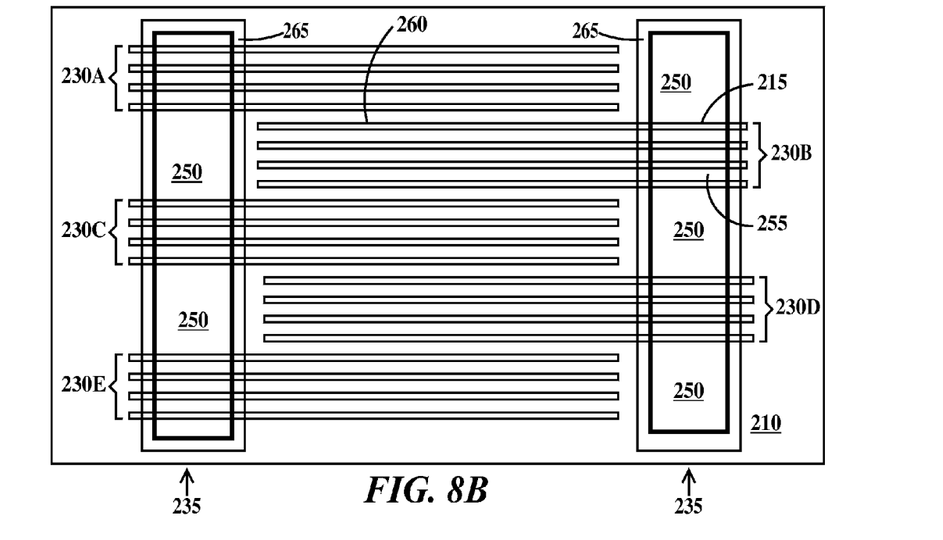

In FIGS. 8A and 8B, spacers 267 are formed on the sidewalls of control gates 250 of MNAB devices. Spacers 267 are also formed on the sidewalls of polysilicon regions 255 between individual nano-fins 260 of sets of nano-fins 230A, 230B, 230C, 230D and 230E. While shown extending from the top surface hardmask layer 215 to the top surface BOX layer 200, spacers 267 need only be thick enough over nano-fins 260 to prevent the source/drain ion implant (described infra) from penetrating into the extension regions of the MNAB FETs. Thus, a source/drain offset is formed between the channel regions and the source/drain regions of the MNAB FETs described infra. This offset reduces gate tunneling near the source and band-to-band tunneling near the drain.

While no spacers are illustrated in FIG. 8A on the sidewalls of nano-fins 260, they may or may not be present depending on the thickness of the conformal layer used to form the spacers, the dimensions of the nano-fins and the etch process used to form the spacers.

Next a source/drain ion implantation is performed into regions of nano-fins 260 not protected by spacers 267 (or other, optional protection layers that may be formed over other regions of the nano-fins, for example, where memory cells are to be formed). If the MNABs are to comprise PFETs, the source/drain ion implantation implants a P-type dopant species. If the MNABs are to comprise NFETs, the source/drain ion implantation implants an N-type dopant species.

An optional metal silicide may be next formed over exposed surfaces of single-crystal silicon and polysilicon.

Figure 9:
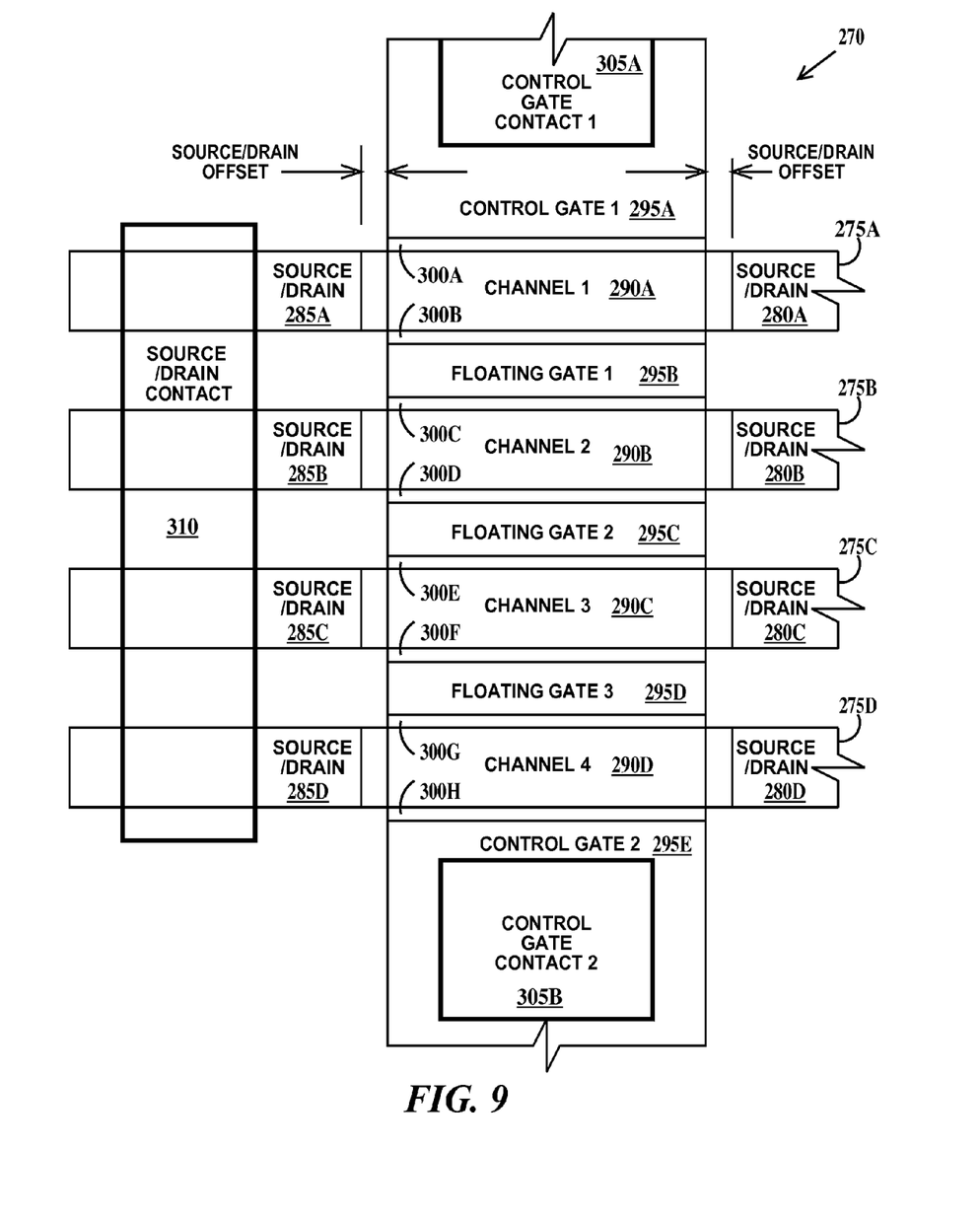
FIG. 9 is a schematic layout of a MNAB according to embodiments of the present invention.

FIG. 9 is a schematic layout of a MNAB according to embodiments of the present invention. In FIG. 9, a MNAB 270 includes four nano-fins 275A, 275B, 275C and 275D, each including corresponding first source/drains 280A, 280B, 280C and 280D, corresponding second source/drains 285A, 285B, 285C and 285D, and corresponding channel regions 290A, 290B, 290C and 290D.

Channel region 290A is positioned between a first control gate 295A and a first floating gate 295B and is electrically isolated from the first control gate by a gate dielectric layer 300A and from the first floating gate by a gate dielectric layer 300B.

Channel region 290B is positioned between first floating gate 295B and a second floating gate 295C and is electrically isolated from the first floating gate by a third gate dielectric layer 300C and from the second floating gate by a gate dielectric layer 300D.

Channel region 290C is positioned between second floating gate 295C and a third floating gate 295D and is electrically isolated from the second floating gate by gate dielectric layer 300F and from the third floating gate by a gate dielectric layer 300F.

Channel region 290D is positioned between third floating gate 295C and a second control gate 295E and is electrically isolated from the third floating gate by gate dielectric layer 300G and from the second control gate by a gate dielectric layer 300H.

A first contact 305A is provided to first control gate 295A and a second contact 305B is provided to second control gate 295E. A common source/drain contact 310 is provided to first source/drains 285A, 285B, 285C and 285D.

Figure 10:
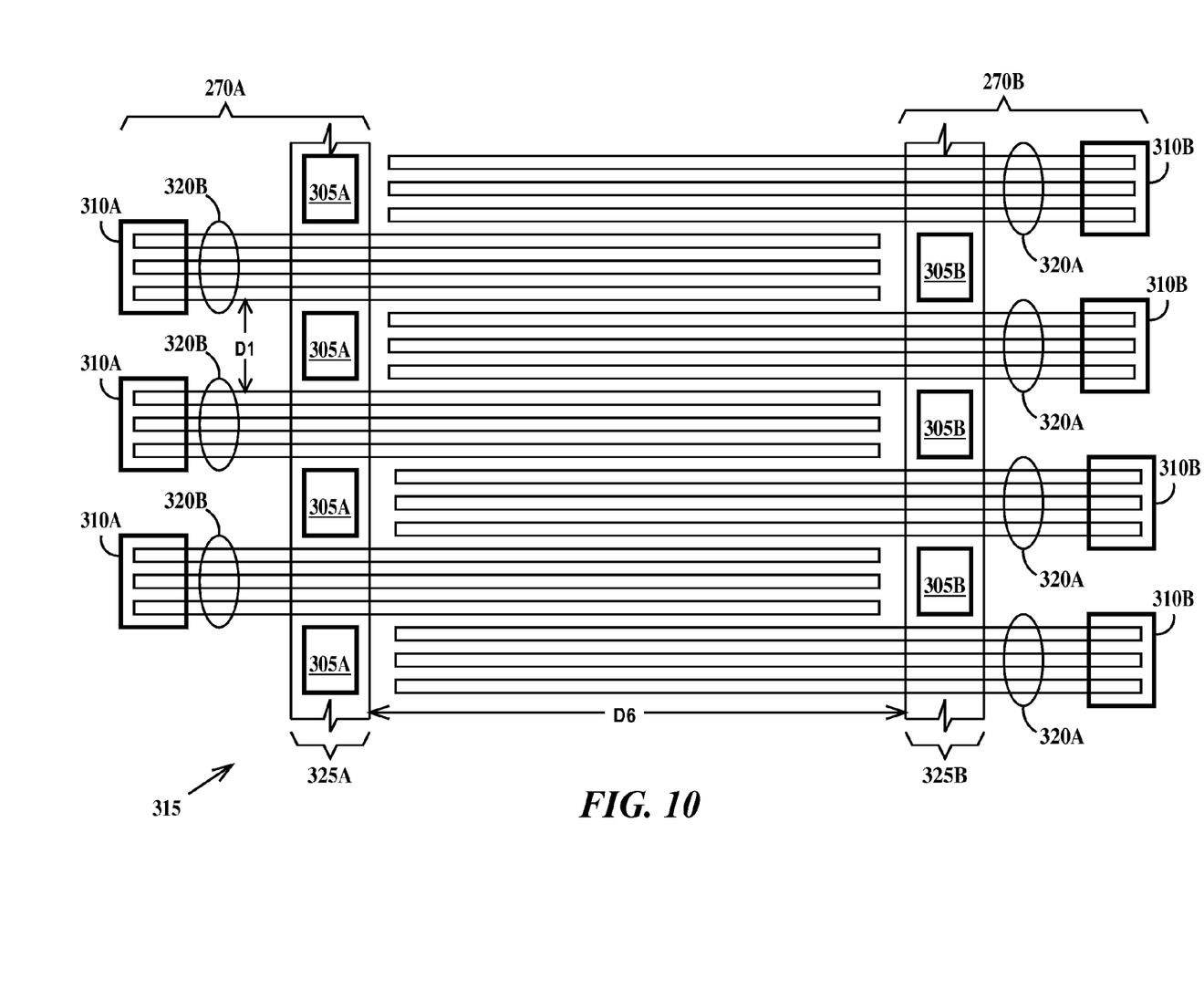
FIG. 10 is a schematic diagram of a wordline or bitline portion of a nano-scale cross bar array (NCA) according to the embodiments of the present invention.

FIG. 10 is a schematic diagram of a wordline or bitline portion of a nano-scale cross bar array (NCA) according to the embodiments of the present invention. In FIG. 10, an NCA includes a nano-fin array 315 which includes alternating and offset nano-fin sets 320A and nano-fin sets 320B (arranged in the same pattern and spacing as nano-fin sets 185A through 185E of FIG. 3B) and first and second MNABs 270A and 270B. On a first side of nano-fin array 315, first MNAB 270A is arranged adjacent to first ends of nano-fin sets 320A and overlap nano-fins sets 320B and on a second side of nano-fin array 315 second MNAB 270B is arranged adjacent to second ends of nano-fin sets 320B and overlap nano-fin sets 320A. MNABs 270A and 270B are similar to MNAB 270 of FIG. 9 described supra. First ends of nano-fin sets 320B are contacted by source/drain contacts 310A, and second ends of nano-fin sets 320A are contacted by source/drain contacts 310B. Second ends of nano-fin sets 320B are interdigitated by gate structures 325A (gate dielectric layers, control gates and floating gates as in FIG. 9) and first ends of nano-fin sets 320A are interdigitated by gate structures 325B (gate dielectric layers, control gates and floating gates as in FIG. 9). In other words, there is a region of gate 325B between each nano-fin of each set of nano-fin sets 320A and there is a region of gate 325A between each nano-fin of each set of nano-fin sets 320B. Each control gate of gate structures 325A is provided with a gate contact 305A, and each control gate of gate structures 325B is provided with a gate contact 305B. First and second nano-fin sets are spaced a distance D1 apart (where D1=W2 of FIG. 3B). It is advantageous for the number and spacing of nano-fins in every nano-fin set be the same number and spacing to reduce the number of different control gate voltages required, though the sets of nano-fins may include different numbers of nano-fins and/or different spacings of nano-fins.

Figure 11:
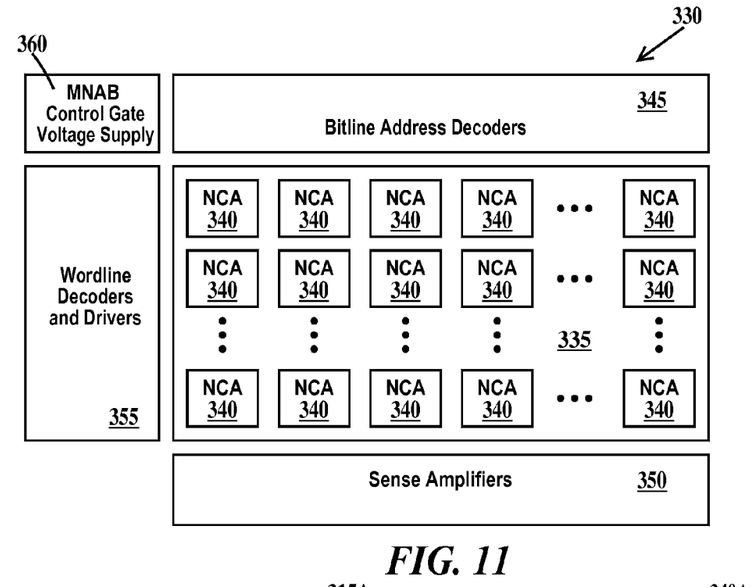
FIG. 11 is a schematic diagram of a memory device incorporating NCAs according to the embodiments of the present invention.

FIG. 11 is a schematic diagram of a memory device incorporating NCAs according to the embodiments of the present invention. IN FIG. 11, a memory device 330 includes an array 335 of NCAs 340, bitline address decoders 345, sense amplifiers 350, wordline decoders and drivers 355 and an MNAB voltage supply 360. Each structure 340 comprises an NCA illustrated in one of FIGS. 12, 13 and 14 and described infra. It is advantageous for each NCA 340 to be identical in size and type, though they may be different in size and type. The voltages (which in one example range between about −8 volts and about +8 volts) required by the control gates to select the various nano-fins of each set of nano-fins in a nano-fin array are generally not the same voltages required by the conventional transistors of bitline address decoders 345, sense amplifiers 350, wordline decoders and drivers 355. Therefore, a separate control gate power supply is required. The positions of wordline and bitline decoders and drivers, control gate voltage supplies and sense amplifiers may vary from those illustrated in FIG. 11.

When NCAs 340 are one dimensional (a single nano-fin array) and used for bitlines in conjunction with conventional (micro-scale) wordlines, bitline address blocks are coupled to MNAB voltage supply 360. When NCAs 340 are one dimensional and used for wordlines in conjunction with conventional (micro-scale) bitlines, wordline decoders and drivers 355 are coupled to MNAB voltage supply 360. When NCAs 340 are two dimensional and used for both wordlines and bitlines, wordline decoders and drivers 355 and bitline address decoders 345 are both coupled to MNAB voltage supply 360.

Figure 12:
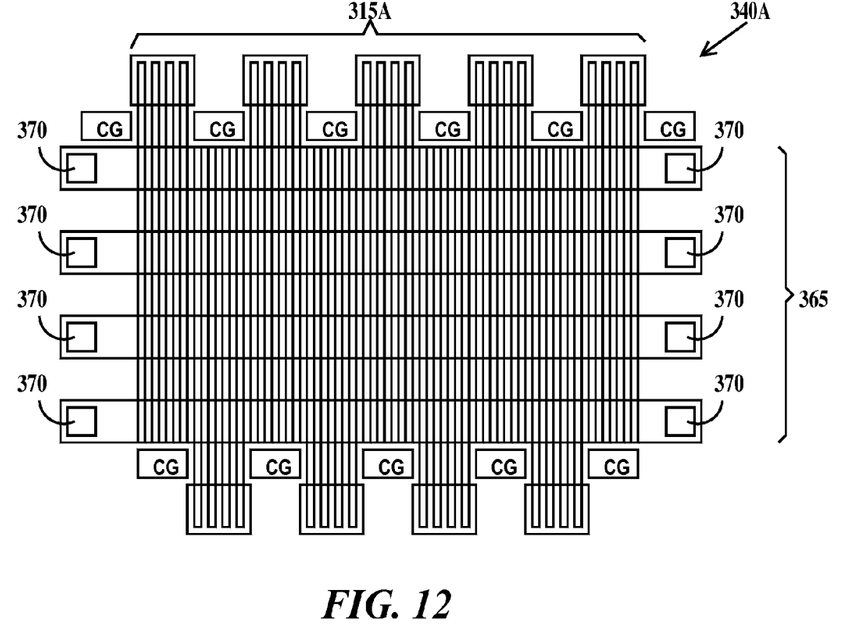
FIG. 12 is a schematic diagram of an exemplary memory array using a one-dimension NCA according to the embodiments of the present invention.

FIG. 12 is a schematic diagram of an exemplary memory array using a one-dimension NCA according to the embodiments of the present invention. In FIG. 12, an NCA 340A (which is an example of NCA 340 of FIG. 11) includes a nano-fin-array 315A (similar to nano-fin array 315 of FIG. 10) and a conventional wire set 365 arranged perpendicular to nano-fin array 315A. Memory elements are located at the crossover points of the nano-fins of nano-fin array 315A and the wires of conventional wire set 365, as illustrated in FIG. 2 and described supra. The positions of control gates are indicated in FIG. 12 by the notation "CG."

Figure 13:
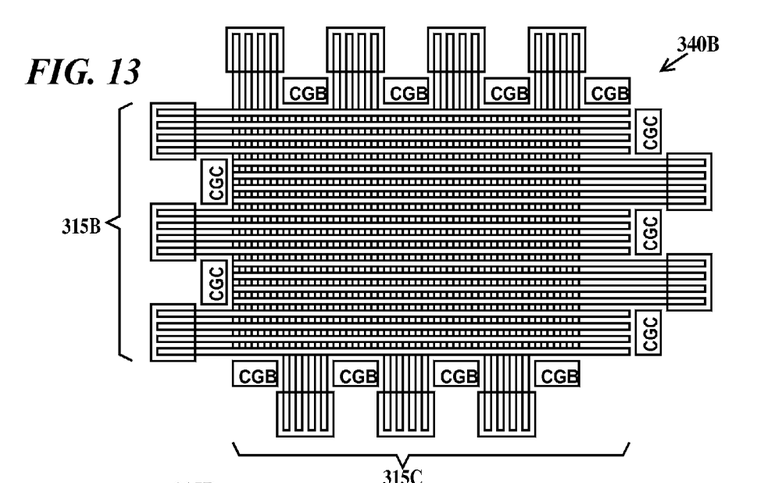
FIG. 13 is a schematic diagram of a first exemplary memory array using a two-dimension NCA according to the embodiments of the present invention.

FIG. 13 is a schematic diagram of a first exemplary memory array using a two-dimension NCA according to the embodiments of the present invention. In FIG. 13, an NCA 340B (which is an example of NCA 340 of FIG. 11) includes a first nano-fin-array 315B (similar to nano-fin array 315 of FIG. 10) and a second nano-fin-array 315C (similar to nano-fin array 315 of FIG. 10) arranged perpendicular to first nano-fin array 315B. Memory elements are located at the crossover points of the nano-fins of first nano-fin array 315B and the nano-fins of second nano-fin array 315C as illustrated in FIG. 2 and described supra. The positions of control gates of first nano-fin array 315B are indicated in FIG. 13 by the notation "CGB" and the positions of control gates of second nano-fin array 315C are indicated in FIG. 13 by the notation "CGC."

Figure 14:
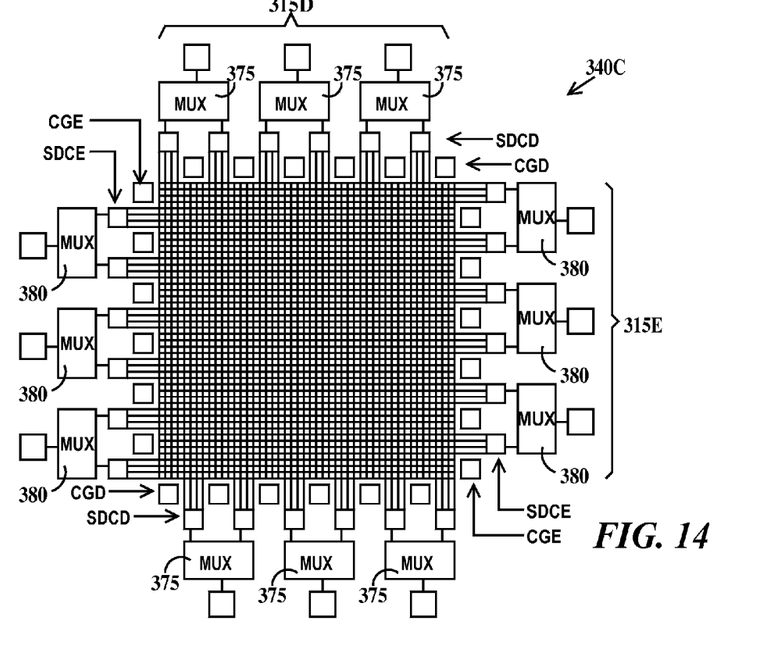
FIG. 14 is a schematic diagram of a second exemplary memory array using a two-dimension NCA according to the embodiments of the present invention.

FIG. 14 is a schematic diagram of a second exemplary memory array using a two-dimension NCA according to the embodiments of the present invention. In FIG. 14, an NCA 340C (which is an example of NCA 340 of FIG. 11) includes a first nano-fin-array 315D (similar to nano-fin array 315 of FIG. 10) and a second nano-fin-array 315E (similar to nano-fin array 315 of FIG. 10) arranged perpendicular to first nano-fin array 315D. Memory elements are located at the crossover points of the nano-fins of first nano-fin array 315D and the nano-fins of second nano-fin array 315E as illustrated in FIG. 2 and described supra. The positions of control gates of first nano-fin array 315D are indicated in FIG. 14 by the notation "CGD" and the positions of control gates of second nano-fin array 315E are indicated in FIG. 13 by the notation "CGE." The positions of source/drain contacts of first nano-fin array 315D are indicated in FIG. 14 by the notation "SDCD" and the positions of source/drain contacts of second nano-fin array 315E are indicated in FIG. 13 by the notation "SDCE."

Each adjacent pair source/drain contacts SDCD of first nano-fin array 315D are connected to a 2:1 multiplexer 375. Each adjacent pair source/drain contacts SDCE of second nano-fin array 315E are connected to a multiplexer 380. The multiplexers reduce the number of source/drain contacts along the periphery of NCA 340C by a factor of 2. This principle can be further extended by using M:1 multiplexers to reduce the number of source/drain contacts along the periphery of NCA 340C by a factor of $2^M$.

NCA 340A of FIG. 12 may be fabricated by:
(1) performing the steps illustrated in FIGS. 4A through 8A and 4B through 8B and described to form a nano-fin array;
(2) forming memory elements connected to points along each nano-fins; and
(3) forming conventional wires crossing over and perpendicular to the nano-fin array and connected at corresponding points along the conventional wires to corresponding memory elements.

NCA 340B of FIG. 13 or NCA 340C of FIG. 14 may be fabricated by:
1) Performing the steps illustrated in FIGS. 4A through 8A and 4B through 8B a first time to form a first nano-fin array;
(2) forming memory elements connected to points along each nano-fins;
(3) forming another semiconductor layer over the memory elements and the first nano-fin array; and
(4) performing the steps illustrated in FIGS. 4A through 8A and 4B through 8B a second time to form a second nano-fin array crossing over and perpendicular to the first nano-fin array and connected at corresponding points along the nano-fins of the second nano-fin array to corresponding memory elements.

Thus the embodiments of the present invention provide for a memory interface device, memory device, memory device architecture and method of fabricating memory devices that use normal photolithographic groundrule and sub-photolithographic groundrule structures while avoiding "pattern-mismatch."

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention.

For example, while the embodiments of the present invention form nano-fins from uppermost the single-crystal layer of an SOI substrate, the nano-fins may be formed from any semiconductor material, examples of which include but are not limited to doped and undoped polysilicon, silicon-germanium and germanium, each formed on a dielectric layer (such as silicon dioxide or silicon nitride) which in turn may be formed on a supporting substrate. Therefore it is intended that the following claims cover all such modifications and changes as fall within the true spirit and scope of the invention.

What is claimed is:

1. A method of fabricating a structure, comprising:
    simultaneously forming first sets of parallel two or more nano-fins and second sets of parallel two or more nano-fins on a dielectric layer, each nano-fin of each of said first and second sets of two or more nano-fins comprising an elongated block of semiconductor material extending axially along a first direction, said second sets of two or more nano-fins interdigitated with said first sets of two or more nano-fins, first ends of nano-fins of said first sets of two or more nano-fins extending past first ends of nano-fins of said second sets of two or more nano-fins in said first direction and second ends of nano-fins of said second sets of two or more nano-fins extending past second ends of nano-fins of said first sets of two or more nano-fins in said first direction;

forming a gate dielectric on all exposed surface of said nano-fins of said first and second sets of nano-fins; and forming a first electrically conductive gate over only said first set of nano-fins and on said gate dielectric in spaces between said nano-fins proximate to said first ends of said first sets of two or more nano-fins; and forming a second electrically conductive gate over only said second set of nano-fins and on said gate dielectric in spaces between said nano-fins proximate to said second ends of said second sets of nano-fins.

2. The method of claim 1, further including:
performing an ion implantation of a first dopant species into top surfaces of said nano-fins of said first and second sets of nano-fins on opposite sides of said gates.

3. The method of claim 1, further including:
forming a set of contacts to said first set of nano-fins, each contact of said set of contacts electrically contacting nano-fins of one set of nano-fins of said first set of nano-fins.

4. The method of claim 1, further including:
before forming said gate dielectric, growing a sacrificial silicon oxide layer on exposed silicon surfaces of said first sets of two or more nano-fins and said second sets of two or more nano-fins; and
removing said sacrificial silicon oxide.

5. The method of claim 1, further including:
forming a hardmask layer on a top surface of a single-crystal silicon layer of a silicon-on-insulator substrate, said silicon-on insulator substrate comprising said silicon layer separated from a base substrate by said dielectric layer.

6. The method of claim 5, wherein said simultaneously forming said first sets of two or more nano-fins and said second sets of two or more nano-fins on said dielectric layer includes etching patterns through said hardmask layer and said single-crystal silicon layer to said dielectric layer, regions of said hardmask layer remaining on top surfaces of all fins of said first sets of two or more nano-fins and said second sets of two or more nano-fins.

7. The method of claim 6, wherein said forming said electrically conductive gates includes:
depositing a polysilicon layer on exposed regions of said dielectric layer, said polysilicon layer filling space between all fins of said first sets of two or more nano-fins and said second sets of two or more nano-fins and all remaining regions of said hardmask layer; and
removing said polysilicon layer and said hardmask layer in selected regions to form said electrically conductive gates said hardmask layer.

8. The method of claim 7, further including:
removing, from all fins of said first sets of two or more nano-fins and said second sets of two or more nano-fins not abutting said electrically conductive gates, said hardmask layer.

9. The method of claim 8, further including:
forming dielectric sidewall spacers on exposed sidewalls of said electrically conductive gates and exposed sidewall regions of said hardmask layer abutting said electrically conductive gates.

10. The method of claim 9, further including:
after said forming said dielectric sidewall spacers, performing an ion implantation of a dopant species into regions of all fins of said first sets of two or more nano-fins and said second sets of two or more nano-fins not protected by said hardmask layer or said dielectric sidewall spacers.

11. A method of fabricating a structure, comprising:
forming a dielectric hardmask layer on a top surface of an upper silicon layer of a silicon-on-insulator substrate, said silicon-on-insulator substrate including a lower single-crystal silicon layer separated from said upper silicon layer by a buried oxide layer;

simultaneously forming first sets of two or more nano-fins and second sets of two or more nano-fins on a dielectric layer, each nano-fin of each of said first and second sets of two or more nano-fins comprising an elongated block of semiconductor material extending axially along a first direction, said second sets of two or more nano-fins interdigitated with said first sets of two or more nano-fins, first ends of nano-fins of said first sets of two or more nano-fins extending past first ends of nano-fins of said second sets of two or more nano-fins in said first direction and second ends of nano-fins of said second sets of two or more nano-fins extending past second ends of nano-fins of said first sets of two or more nano-fins in said first direction;

forming a gate dielectric on all exposed surface of said nano-fins of said first and second sets of nano-fins;

filling all spaces between said nano-fins of said first and second sets of nano-fins with a polysilicon layer, a top surface of said polysilicon layer coplanar with a top surfaces of said hardmask layer;

forming a gate mask on said top surface of said polysilicon layer and top surfaces of said hardmask layer, said gate mask extending over regions of said first ends of said nano-fins of said first set of nano-fins, but not over any portion of said nano-fins of said second set of nano-fins; and removing said polysilicon layer, where said polysilicon layer is not protected by said gate mask, followed by removing said hardmask layer where said hardmask layer is not protected by said gate mask, followed by removing said gate mask.

12. The method of claim 11, further including:
performing a first ion implantation of a first dopant species into top surfaces of said nano-fins of said first and second sets of nano-fins, where nano-fins of said first and second sets of nano-fins are not protected by said hardmask layer;

after performing said first ion implantation, forming a sidewall dielectric layer on exposed sidewalls of said polysilicon layer and exposed sidewalls of said hardmask layer; and after forming said sidewall dielectric layer, performing a second ion implantation of a second dopant species into said top surfaces of said nano-fins of said first and second sets of nano-fins, where nano-fins of said first and second sets of nano-fins are not protected by said hardmask layer or by said sidewall dielectric layer.

13. The method of claim 12, wherein said first and second ion implantations are both N type or said first and second ion implantations are both P type.

14. The method of claim 12, further including:
doping said upper silicon layer P type, wherein said first and second ion implantations are both N type; or
doping said upper silicon layer N type, wherein said first and second ion implantations are both P type.

15. The method of claim 11, further including:
forming a set of contacts to said first sets of nano-fins, each contact of said set of contacts electrically contacting all nano-fins of one set of nano-fins of said first sets of nano-fins.

16. The method of claim 15, further including:
forming an additional set of contacts to said second set of nano-fins, each contact of said additional set of contacts electrically contacting all nano-fins of one set of nano-fins of said second sets of nano-fins.

17. The method of claim 11 further including:
forming an additional gate mask on said top surface of said polysilicon layer and said top surface of said hardmask layer, said additional gate mask extending over regions of said second ends of nano-fins of said second set of nano-fins, but not over any portion of nano-fins of said first set of nano-fins; and
removing said polysilicon layer, where said polysilicon layer is not protected by said additional gate mask, followed by removing said hardmask layer where said hardmask layer is not protected by said additional gate mask, followed by removing said additional gate mask.

18. The method of claim 11, wherein pitches of all nano-fins of all first and second sets of nano-fins sets in a second direction perpendicular to said first direction are less than a smallest pitch lithographically definable by a photolithographic system used to define said gate mask.

19. The method of claim 11, wherein said simultaneously forming said first sets of two or more nano-fins and said second sets of two or more nano-fins on said dielectric layer includes etching patterns through said hardmask layer and said single-crystal silicon layer to said dielectric layer, regions of said hardmask layer remaining on top surfaces of all fins of said first sets of two or more nano-fins and said second sets of two or more nano-fins.

20. The method of claim 19, wherein said filling all spaces between said nano-fins of said first and second sets of nano-fins with a polysilicon layer said electrically conductive gates includes:
depositing said polysilicon layer on exposed regions of said dielectric layer, said polysilicon layer filling space between all fins of said first sets of two or more nano-fins and said second sets of two or more nano-fins and all remaining regions of said hardmask layer; and
performing a chemical mechanical polish to coplanarize said top surfaces of said polysilicon layer and said top surfaces of said hardmask layer.

* * * * *